United States Patent

Roth

[11] Patent Number: 5,826,329
[45] Date of Patent: *Oct. 27, 1998

[54] METHOD OF MAKING PRINTED CIRCUIT BOARD USING THERMAL TRANSFER TECHNIQUES

[75] Inventor: Joseph D. Roth, Springboro, Ohio

[73] Assignee: NCR Corporation, Dayton, Ohio

[*] Notice: This patent issued on a continued prosecution application filed under 37 CFR 1.53(d), and is subject to the twenty year patent term provisions of 35 U.S.C. 154(a)(2).

[21] Appl. No.: 574,734

[22] Filed: Dec. 19, 1995

[51] Int. Cl.$^6$ .............................. H05K 3/12; H05K 3/46
[52] U.S. Cl. ................................ 29/846; 29/830; 29/847; 174/257; 427/96; 427/148
[58] Field of Search .............................. 29/830, 840, 846, 29/847; 101/32, 34, 489; 174/250, 256, 257; 427/96, 148, 150, 511

[56] References Cited

U.S. PATENT DOCUMENTS

| | | | |
|---|---|---|---|
| 2,582,685 | 1/1952 | Eisler | 427/96 |
| 3,350,250 | 10/1967 | Sanz et al. | 29/846 X |
| 3,778,899 | 12/1973 | Johnson | 29/846 X |
| 4,343,083 | 8/1982 | Takemura et al. | 29/847 X |
| 4,403,410 | 9/1983 | Robinson | 29/830 |
| 4,991,287 | 2/1991 | Piatt et al. | 29/840 |
| 5,013,397 | 5/1991 | Tsukakoshi | 29/846 X |
| 5,184,111 | 2/1993 | Pichl | 29/846 X |
| 5,426,850 | 6/1995 | Fukutomi et al. | 29/847 X |

FOREIGN PATENT DOCUMENTS 61-96845 7/1994 Japan ....................... 29/846

OTHER PUBLICATIONS

Darryl Lindsey, "The Design & Drafting Of Printed Circuits", Published by Bishop Graphics, Inc., Westlake Village, CA 91359, 1979, distributed by McGraw–Hill Book Company, pp. 4–9.

Raymond H. Clark, "Handbook of Printed Circuit Manufacturing", Van Nostrand Reinhold Company, New York, 1985, pp. 261–269.

Clyde F. Coombs, Jr., "Printed Circuitrs Handbook", Hewlett–Packard Company, Palo Alto, CA, McGraw–Hill Book Company, 1988, pp. 11.1–14.9.2.

Primary Examiner—Peter Vo
Attorney, Agent, or Firm—Charlene Stukenborg

[57] ABSTRACT

A method of making a printed circuit board using thermal transfer techniques to transfer electrically conductive coating from a thermal transfer ribbon to a non-conductive surface of a non-conductive receiver board. The electrically conductive material transferred to the receiver board form traces on the non-conductive surface of the non-conductive receiver board, thus providing a printed circuit board.

14 Claims, 4 Drawing Sheets

METHOD OF MAKING PRINTED CIRCUIT BOARD USING THERMAL TRANSFER TECHNIQUES

BACKGROUND OF THE INVENTION

The present invention relates to new and novel improvements in printed circuit boards and methods for making. More particularly, the present invention is directed to printed circuit boards and methods for making printed circuit boards using thermal transfer techniques to print conductive traces onto receiver boards.

To make a typical printed circuit board, a manufacturer uses a print and etch process. The manufacturer starts with a copper clad substrate and artwork of the desired printed circuit. The copper clad substrate is drilled and prepared. Then the manufacturer images the circuit pattern onto the copper clad substrate using either a silk screening or photoprinting (using either a positive or negative photoresist) process. For silk screening, an ink plated resist is used with a screened pattern of the circuit. Alternatively, a dry film or liquid photoresist may be used. Either method provides a resist on the copper clad substrate. The resist is exposed to ultraviolet light which causes the resist to polymerize and to be etch resistant. Unexposed resist is stripped away using solvents or chemicals, leaving the circuit pattern protected while the unwanted copper is exposed for etching.

The etchant is typically a strong oxidizing agent which etches excess copper away from unprotected regions of the board. Common etching systems are based on alkaline ammonia, hydrogen peroxide-sulfuric acid, ferric chloride, or cupric chloride. After etching is completed, the manufacturer removes the remaining resist. Removal of the resist involves the use of more solvents and chemicals, such as methylene chloride, toluene, trichloroethylene, methyl alcohol, and sodium or potassium hydroxide. Increasingly stringent environmental regulations make the use and disposal of solvents and chemicals difficult and expensive.

Ink jet printing technology has also been used to make traces for printed circuit boards. Ink jet technology uses a printer mechanism that sprays liquid ink onto a receiver board. However, the inks compatible with ink jet technology may not provide the desired conductivity. There is a need for printed circuit boards made by a flexible process which does not require many steps, such as the print and etch process, but still provides traces with suitable electrical conductivity.

SUMMARY OF THE INVENTION

In accordance with the teachings of the present invention, printed circuit boards made using thermal transfer techniques to print electrically conductive material forming traces on a receiver board are provided. The electrically conductive material is formulated in a coating portion of a thermal transfer ribbon. Heat from a thermal printhead is applied to the ribbon and causes the electrically conductive material to transfer from the ribbon to a receiver board, forming electrically conductive traces.

An object of the present invention is to provide a printed circuit board which does not require many steps for making the printed circuit board.

Another object of the present invention is to provide a printed circuit board and methods for making using thermal transfer techniques in which electrically conductive material is printed upon the receiver board only where needed.

Still another object of the present invention is to provide methods for making a printed circuit board using thermal transfer techniques which reduce the use of solvents and chemicals.

Yet another object of the present invention is to provide a printed circuit board having electrically conductive material forming traces with the electrically conductive material being transferred from a thermal transfer ribbon.

These and other objects of the present invention are attained by providing printed circuit boards having electrically conductive material printed on receiver boards using thermal transfer techniques.

Other objects, advantages and novel features of the present invention will become apparent in the following detailed description of the invention when considered in conjunction with the accompanying drawings.

DETAILED DESCRIPTION

Figure 1:
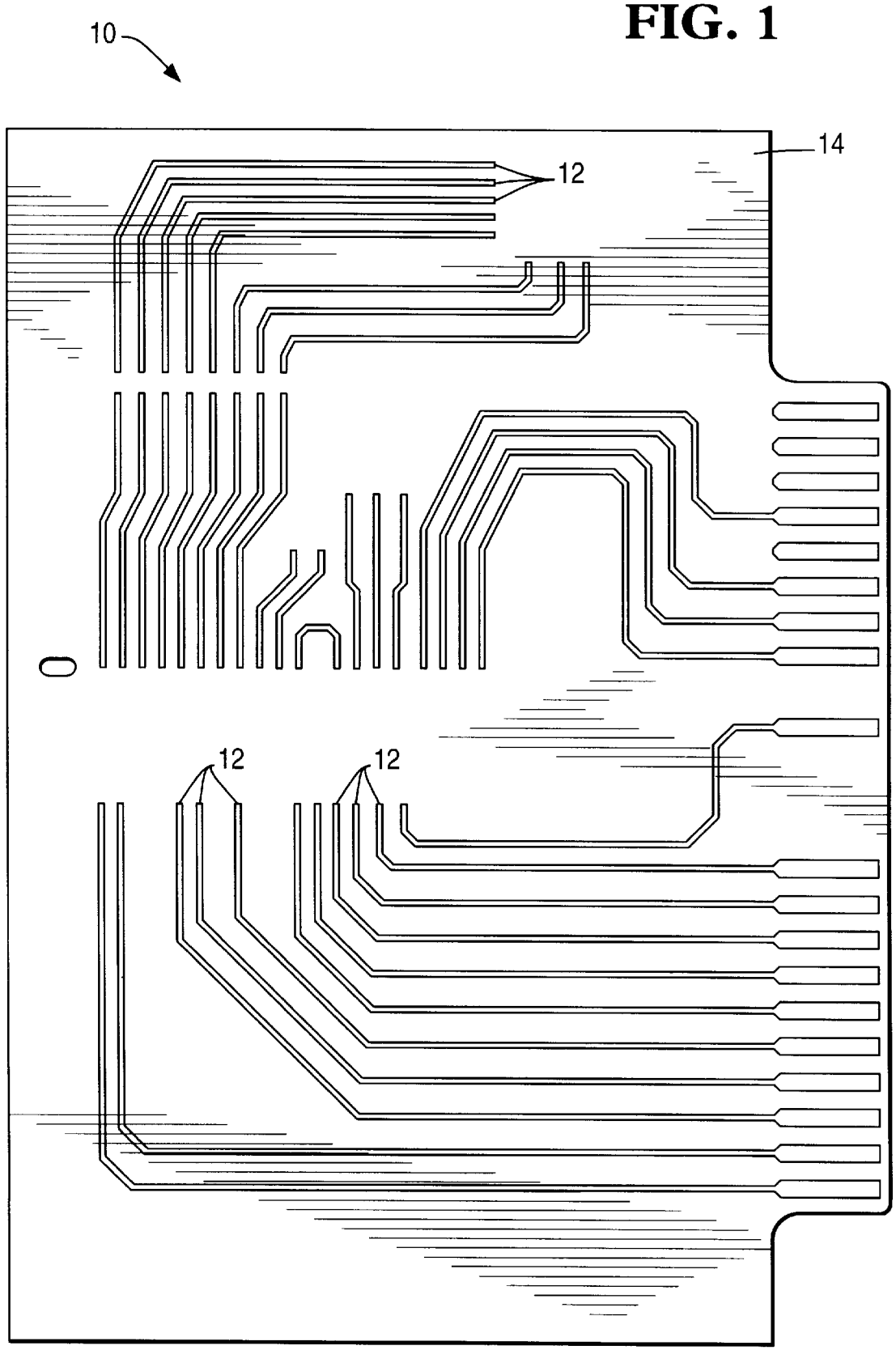
FIG. 1 is a schematic view of a printed circuit board constructed in accordance with the present invention.

The present invention is directed to a printed circuit board and a method of making the printed circuit board. A printed circuit board 10 having electrically conductive traces printed thereon in accordance with the present invention is illustrated in FIG. 1.

The printed circuit board 10 comprises a receiver board 14 and electrically conductive traces 12. Receiver board 14 is preferably a fiberglass board or laminate. Electrically conductive traces 12 are printed on the receiver board 14. Electrically conductive traces 12 can be made to form varying patterns depending on the requirements of the desired printed circuit board.

Figure 2:
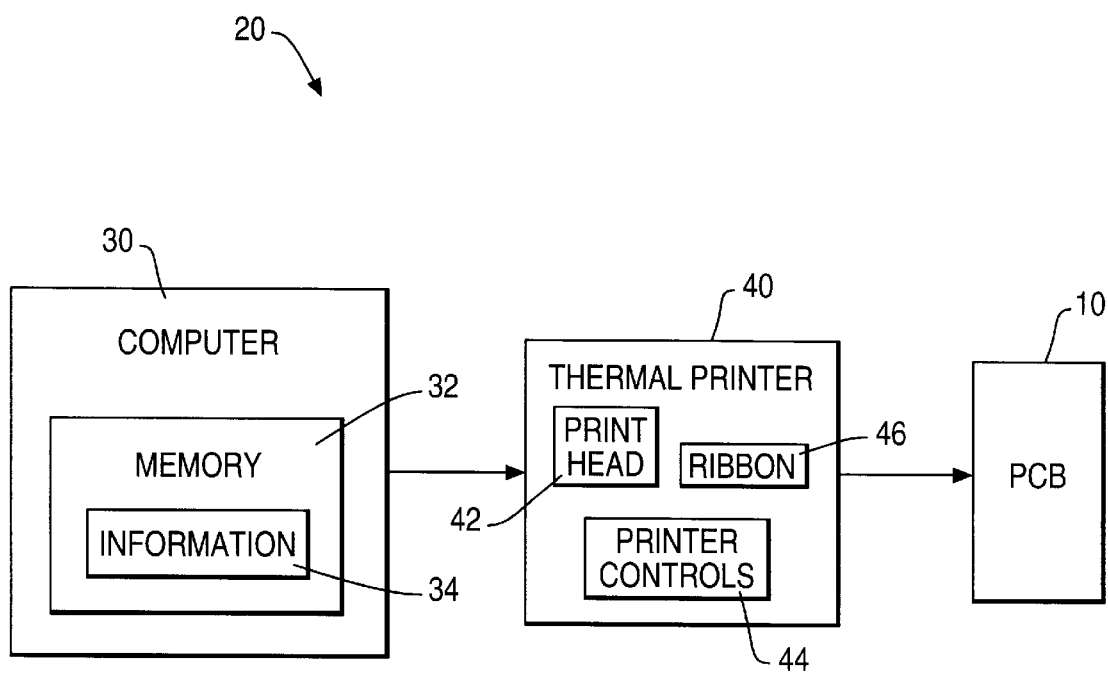
FIG. 2 is a block diagram of a computer system for producing the printed circuit board of FIG. 1.

The electrically conductive traces 12 are printed on receiver board 14 using a computer system 20 as shown in FIG. 2. Computer system 20 includes a computer 30 containing memory 32 for storing information 34 relating to the location of the electrically conductive traces 12. The information 34 stored in memory 32 may be input from an external device such as a floppy disk. Alternatively, the information 34 may be generated by a design program installed in computer 30.

Computer system 20 further includes a thermal printer 40. The printer 40 includes a thermal printhead 42 and printer controls 44 which receive the information 34 from the computer 30 and use the information 34 to instruct the printhead 42. Printer 40 may be any type of thermal transfer printer or hot stamp machine which can accomodate printing on a flat or relatively inflexible medium such as the receiver board 14 of FIG. 1. An example of such a thermal transfer printer is the TEC B-872 Thermal Printer made by TEC America, Inc., Corporate Office, 4401-A Bankers Circle, Atlanta, Ga. 30360. A customized thermal transfer printer could be used if circuit requirements dictate a more precise system.

Figure 3:
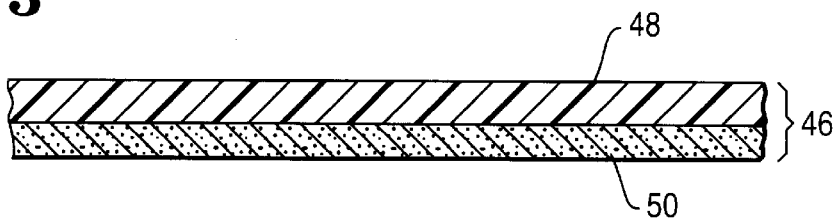
FIG. 3 is a sectional view of a thermal transfer ribbon used to make the printed circuit board of FIG. 1.

The printer 40 includes a thermal transfer ribbon 46, as shown in FIGS. 2 and 3. Thermal transfer ribbon 46 is formed by known processes and comprises a base or substrate 48 and a coating 50 disposed on the substrate 48. Base or substrate 48 is a thin, smooth, tissue-type paper or polyester-type plastic, or like material. Coating 50 is thermally activated. Coating 50 may include waxes, resins and pigments. Coating 50 is an electrically conductive coating. Coating 50 can be formulated with conducting polymer such as poly(sulfur nitride), also known as polythiazyl, and cis-polyacetylene doped with $AsF_5$. Coating 50 can also be formulated using non-conducting polymer filled with conducting pigments such as electrically conductive carbon black, powder copper, nickel, aluminum or silver. The electrically conductive material is fairly uniformly dispersed throughout the coating material. The specific formulation of the coating 50 may vary. An example of a formulation of the coating 50 is provided in the following table of ingredients.

TABLE OF INGREDIENTS

|  | Use | % Dry | Dry (g) | Wet (g) |
|---|---|---|---|---|
| Butyl Acetate | Solvent | NA | NA | 300.0 |
| Diglycidyl ether bisphenol A (DGEBA) | Binder/Epoxy | 50.0 | 37.5 | 37.5 |
| Novolac epoxy | Binder/Epoxy | 5.0 | 3.7 | 3.7 |
| Modified Polyamine | Hardener | 10.0 | 7.5 | 7.5 |
| Copper Powder | Conductive Particle | 35.0 | 26.3 | 26.3 |

In the above formulation, the diglycidyl ether bisphenol A (DGEBA) is marketed as "Araldite GT7013" by Ciba-Geigy Corporation in Hawthorne, N.Y. The novolac epoxy is marketed as "Epon 164" by Shell Chemical Co. in Houston, Tex. The modified polyamine is marketed as "Ancamine 2014FG" by Air Products in Allentown, Pa. The copper powder is marketed as "357 Flake Copper" by SCM Metal Products in Research Triangle Park, N.C. The backing element is marketed as "Polyester Mylar Film" by E.I. Dupont de Nemours & Co., Incorporated in Wilmington, Del.

To make the coating 50, dissolve DGEBA and novolac epoxy in solvent. Add modified polyamine under agitation to provide a mixture. Transfer the mixture to the vessel of an attritor with a cooling jacket. Start the attritor (200–250 rpm) and add copper powder, ensuring that the temperature of the content in the vessel does not exceed 120° F. Grind for two hours to provide a coating mixture. Apply the coating mixture to a substrate such as Polyester terephthalate (PET) film with a coat weight of 1.2 $g/m^2$ to 45 $g/m^2$. The thermal transfer ribbon 46 is formed when the coating mixture applied to the substrate dries. The coating should not exceed 120° F. during drying.

Figure 4:
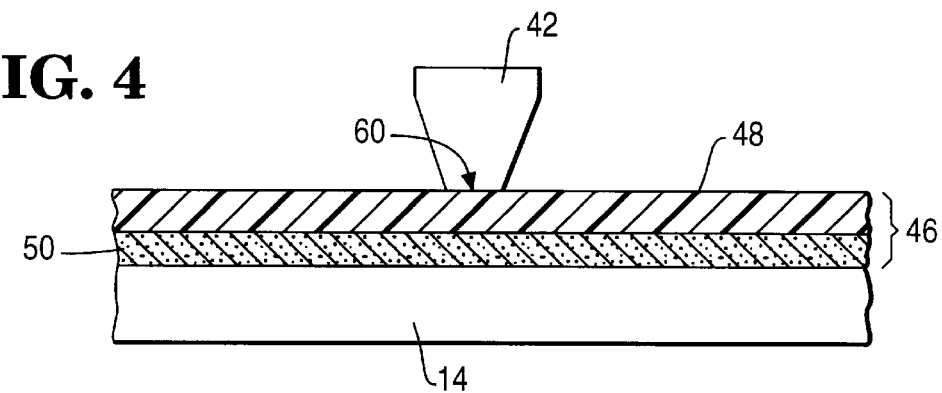
FIG. 4 is a sectional view of the thermal transfer ribbon of FIG. 3 in contact with a printhead of the computer system of FIG. 2.

To make an electrically conductive trace 12 on the receiver board 14, the thermal transfer ribbon 46 is first positioned over the receiver board 14 as shown in FIG. 4. The computer communicates with the printer controls 44, sending the information contained in memory 32 indicating the location of the electrically conductive traces 12 to be printed on the receiver board 14. As instructed by printer controls 44, the printhead 42 moves along the ribbon 46 until the printhead 42 is positioned over a portion 60 of the ribbon as shown in FIG. 4.

Printhead 42 includes heating elements, such as fast response thin film resistors. Intense heating of selected heating elements of the printhead 42 causes the transfer of part of the coating 50 from the ribbon 46 onto receiver board 14. The number and location of selected heating elements in the printhead 42 determines the part of the coating transferred to the receiver board 14.

Figure 5:
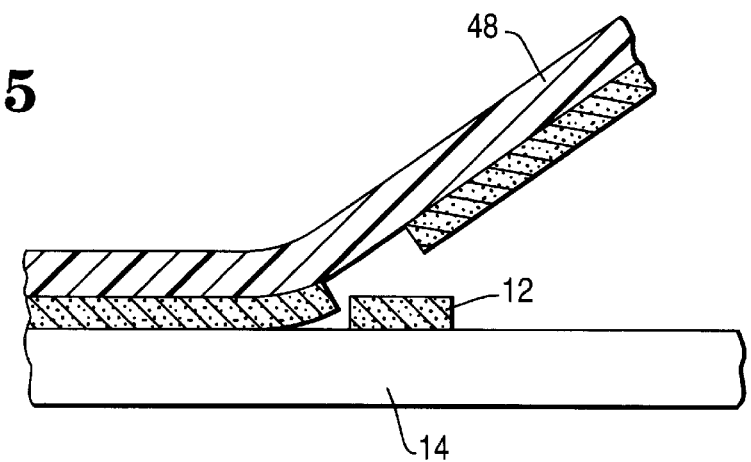
FIG. 5 is a sectional view similar to FIG. 4 and showing a part of a coating of the ribbon of FIG. 3 transferred to the receiver board of FIG. 1.
Figure 6:
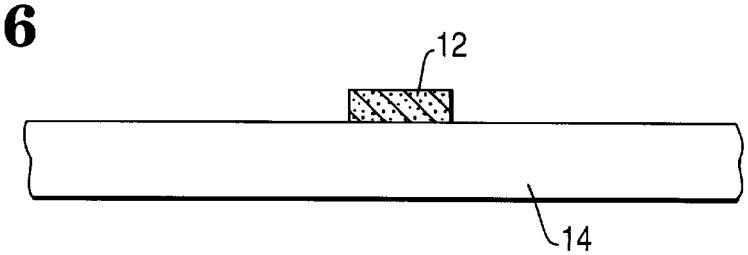
FIG. 6 is a sectional view similar to FIG. 5 and showing the remaining ribbon moved away from the receiver board.

After the printhead 42 applies heat to the portion 60 of ribbon 46, the ribbon 46 as shown in FIG. 4 is pulled away from receiver board 14 and moved to a position such as shown in FIG. 5, part 12 (FIG. 5) of the coating 50 remains adhered to the receiver board 14 due to the heat being applied to the portion 60 of the ribbon. As a result of the ribbon being moved away from the portion shown in FIG. 5, the ribbon becomes a used ribbon. The used ribbon shown in FIG. 5 continues to move away from the receiver board 14 until it is completely moved away as shown in FIG. 6. The part 12 of the coating 50 remaining on the receiver board 14, as shown in FIG. 6, then cools to form part of an electrically conductive trace 12 as shown in FIG. 1.

The above steps of positioning the printhead 42 over the portion 60 of the ribbon 46, applying heat to the portion 60 of the ribbon 46, and causing the part 12 of the coating 50 to transfer to the receiver board 14 are repeated until all of the desired electrically conductive traces 12 have been printed on the receiver board 14, forming the printed circuit board 10.

If desired, multilayer boards can be prepared by printing each layer as a separate printed circuit board. Then the separate printed circuit boards can be bonded to form a single multilayer printed circuit board.

Figure 7:
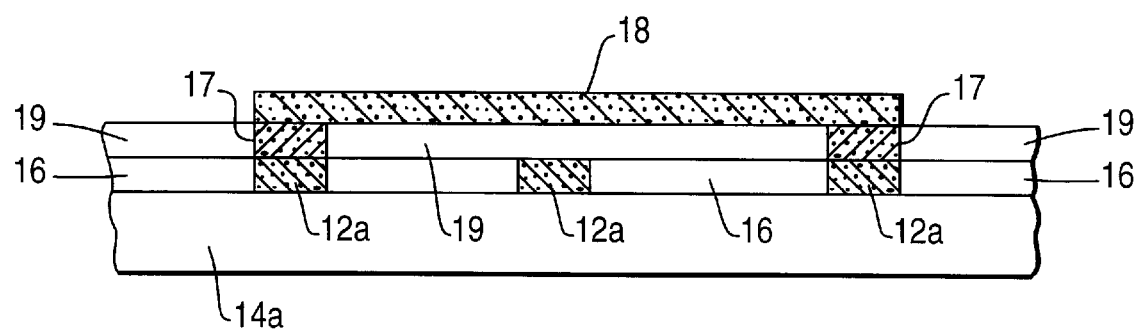
FIG. 7 is a sectional view of a multilayer printed circuit board.

Alternatively, FIG. 7 shows a multilayer board having layers printed according to the present invention. Since the invention illustrated in FIG. 7 is generally similar to the that shown in FIGS. 1–6, similar reference numerals are utilized to designate similar components, the suffix letter "a" being associated with FIG. 7 to avoid confusion. Multilayer printed circuit boards are prepared by printing conductive traces 12a on receiver board 14a according to the present invention, forming a part of a first layer. Next a non-conductive part 16 of the first layer is printed between the conductive traces 12a of the first layer using the above described thermal transfer techniques. The non-conductive part is formed using a non-conductive ribbon made using the following formulation and process:

TABLE OF INGREDIENTS

|  | Use | % Dry | Dry (g) | Wet (g) |
|---|---|---|---|---|
| Butyl Acetate | Solvent | NA | NA | 300.0 |
| Diglycidyl ether bisphenol A (DGEBA) | Binder/Epoxy | 77.0 | 57.8 | 57.8 |
| Novolac epoxy | Binder/Epoxy | 7.6 | 5.7 | 5.7 |
| Modified Polyamine | Hardener | 15.4 | 11.5 | 11.5 |

In the above formulation, the diglycidyl ether bisphenol A (DGEBA) is marketed as "Araldite GT7013" by Ciba-Geigy Corporation in Hawthorne, N.Y. The novolac epoxy is marketed as "Epon 164" by Shell Chemical Co. in Houston, Tex. The modified polyamine is marketed as "Ancamine 2014FG" by Air Products in Allentown, Pa. The backing element is marketed as "Polyester Mylar Film" by E.I. Dupont de Nemours & Co., Incorporated in Wilmington, Del.

To make the coating 50, dissolve DGEBA and novolac epoxy in solvent. Add modified polyamine under agitation to provide a mixture. Transfer the mixture to the vessel of an attritor with a cooling jacket. Start the attritor (200–250 rpm), ensuring that the temperature of the content in the vessel does not exceed 120° F. Grind for two hours to provide a coating mixture. Apply the coating mixture to a substrate such as Polyester terephthalate (PET) film with a coat weight of 1.2 $g/m^2$ to 45 $g/m^2$. The thermal transfer ribbon 46 is formed when the coating mixture applied to the substrate dries. The coating should not exceed 120° F. during drying.

A non-conductive part 19 of a second layer is also printed on top of the conductive traces 12a which are not required to conduct to another layer and on top of the non-conductive part 16 of the first layer. For conductive traces required to conduct to another layer, conductive traces 17 are printed on conductive traces 12a, forming a conductive part of the second layer. Next, to form a conductive part of a third layer, conductive traces 18 are printed on the conductive traces 17 and also on the non-conductive part 16 of the second layer to electrically connect the conductive traces 17. This process of printing layers can be used to make a multilayer printed circuit board having any desired number of layers and having conductive traces connecting layers as desired.

A number of advantages result by printing electrically conductive traces on a receiver board to form a printed circuit board in accordance with the present invention as described hereinabove. One advantage is that the above described system decreases the time and expense needed to produce a printed circuit board. The products and methods of the present invention are particularly suitable for situations where custom printed circuit boards, small production runs and low volume prototype printed circuit boards are produced.

The methods of the present invention also reduce the amount of time required to get a new design into production by allowing printed circuit board designs to go directly from the computer to the manufacture of the printed circuit board. A further advantage of the methods for printing printed circuit boards using thermal transfer techniques is that unused electrically conductive material remains with the polyester substrate of the thermal transfer ribbon which can be readily sent to a central recycling facility for recovery and reuse.

Although the present invention has been described above in detail, the same is by way of illustration and example only and is not to be taken as a limitation on the present invention. Accordingly, the scope and content of the present invention are to be defined only by the terms of the appended claims.

What is claimed is:

1. A method of printing electrically conductive traces on a receiver board comprising the steps of:
   positioning a ribbon having a thermally active electrically conductive coating over a non-conductive surface of a non-conductive receiver board; and
   applying heat to a portion of said ribbon causing a portion of said coating to transfer to the non-conductive surface of the non-conductive receiver board forming the electrically conductive traces on the non-conductive surface of the non-conductive receiver board.

2. The method of claim 1 wherein said coating includes conductive polymers.

3. The method of claim 1 wherein said coating includes non-conductive polymers filled with a conductive pigment.

4. The method of claim 3 wherein said conductive pigment is copper.

5. A method of making a printed circuit board having electrically conductive traces thereon, comprising the steps of:
   a) positioning a ribbon with a thermally reactive electrically conductive coating over a portion of a non-conductive surface of a non-conductive receiver board;
   b) applying heat to a portion of the ribbon using a thermal printhead, wherein the heat causes a part of the coating to transfer to the non-conductive surface of the non-conductive receiver board; and
   c) repeating steps a) and b) for varying portions of the non-conductive receiver board and the ribbon until the electrically conductive traces have been formed on the non-conductive surface of the non-conductive receiver board.

6. The method of claim 5 wherein said coating includes conductive polymers.

7. The method of claim 5 wherein said coating includes non-conductive polymers filled with a conductive pigment.

8. The method of claim 7 wherein said conductive pigment is copper.

9. A method of making a printed circuit board having electrically conductive traces thereon, comprising the steps of:
   a) instructing printer controls where to locate electrically conductive traces;
   b) positioning a ribbon with a thermally reactive electrically conductive coating over a portion of a non-conductive surface of a non-conductive receiver board;
   c) applying heat to a portion of the ribbon using a thermal printhead, wherein the heat causes a part of the coating to transfer to the non-conductive surface of the non-conductive receiver board; and
   d) repeating steps b) and c) for varying portions of the non-conductive receiver board and the ribbon as controlled by the printer controls until the electrically conductive traces have been formed on the non-conductive surface of the non-conductive receiver board.

10. The method of claim 9 wherein the step of instructing printer controls further includes receiving the instructions from a design computer in communication with the printer controls.

11. The method of claim 9 wherein said coating includes conductive polymers.

12. The method of claim 9 wherein said coating includes non-conductive polymers filled with a conductive pigment.

13. The method of claim 12 wherein said conductive pigment is copper.

14. A method of making a multilayer printed circuit board, comprising the steps of:
   a) positioning a first ribbon with a thermally reactive electrically conductive coating over a portion of a receiver board;
   b) applying heat to a portion of the first ribbon using a thermal printhead, wherein the heat causes a part of the coating to transfer to the receiver board;
   c) repeating steps a) and b) for varying portions of the receiver board and the first ribbon until a first set of electrically conductive traces have been formed on the receiver board, forming a conductive part of a first layer;

d) positioning a second ribbon with a thermally reactive electrically non-conductive coating over a portion of the receiver board;

e) applying heat to a portion of the second ribbon using a thermal printhead, wherein the heat causes a part of the coating to transfer to the receiver board;

f) repeating steps d) and e) for varying portions of the receiver board and the second ribbon until a non-conductive part of the first layer has been printed on the receiver board between the electrically conductive traces;

g) positioning the first ribbon with a thermally reactive electrically conductive coating over at least a portion of the first set of electrically conductive traces, forming a conductive part of a second layer;

h) applying heat to a portion of the first ribbon using a thermal printhead, wherein the heat causes a part of the coating to transfer to the first layer;

i) repeating steps g) and h) for varying portions of the first layer and the first ribbon until a second set of electrically conductive traces have been formed;

j) positioning the second ribbon with a thermally reactive electrically non-conductive coating over a portion of the first layer;

k) applying heat to a portion of the second ribbon using a thermal printhead, wherein the heat causes a part of the coating to transfer to the first layer;

l) repeating steps j) and k) for varying portions of the first layer and the second ribbon until a non-conductive part of a second layer has been printed on the first layer between the electrically conductive traces of the second layer;

m) positioning the first ribbon with a thermally reactive electrically conductive coating over at least a portion of the second layer;

n) applying heat to a portion of the first ribbon using a thermal printhead, wherein the heat causes a part of the coating to transfer to the second layer; and o) repeating steps m) and n) for varying portions of the second layer and the first ribbon until a third set of electrically conductive traces have been formed.

* * * * *